United States Patent [19]
Schaenzer et al.

[11] Patent Number: 6,046,596
[45] Date of Patent: Apr. 4, 2000

[54] CAPACITANCE PROBE FOR MAGNETIC RECORDING HEAD TRANSDUCER TO DISC SURFACE SPACING MEASUREMENT

[75] Inventors: Mark J. Schaenzer, Eagan, Minn.; Joseph C. Liu, Singapore, Singapore; Zine-Eddine Boutaghou, St. Paul, Minn.

[73] Assignee: Seagate Technology, Inc., Scotts Valley, Calif.

[21] Appl. No.: 08/804,090

[22] Filed: Feb. 20, 1997

Related U.S. Application Data

[60] Provisional application No. 60/031,074, Nov. 13, 1996.

[51] Int. Cl.[7] ........................... G01R 27/26; G11B 5/455; G01B 7/14
[52] U.S. Cl. ............................... 324/662; 324/661; 360/6
[58] Field of Search .................... 324/661, 662, 324/687; 360/6, 31, 119

[56] References Cited

U.S. PATENT DOCUMENTS

| | | |
|---|---|---|
| 3,825,323 | 7/1974 | Landwer ........................ 324/622 X |
| 4,669,011 | 5/1987 | Lemke ............................... 360/103 |
| 4,777,544 | 10/1988 | Brown et al. ...................... 360/75 |
| 4,881,136 | 11/1989 | Shiraishi et al. .................... 360/25 |
| 4,931,887 | 6/1990 | Hegde et al. .................. 324/662 X |
| 4,942,609 | 7/1990 | Meyer ................................ 360/25 |
| 5,136,250 | 8/1992 | Abdelli ............................. 324/661 |
| 5,410,439 | 4/1995 | Egbert et al. ...................... 360/75 |
| 5,488,857 | 2/1996 | Homma et al. .................... 73/105 |

*Primary Examiner*—Glenn W. Brown
*Attorney, Agent, or Firm*—Westman, Champlin & Kelly, P.A.

[57] ABSTRACT

An apparatus for measuring magnetic recording head transducer to disc surface spacing and a method of fabricating the same are disclosed. A slider body of a read/write head has first and second rails forming portions of an air bearing surface of the slider body. First and second cavities are formed in the first and second rails of the slider body at the air bearing surface. First and second capacitance plates are positioned within the first and second cavities, respectively, such that a surface of each of the first and second capacitance plates is substantially coplanar with at least portions of the air bearing surface.

15 Claims, 8 Drawing Sheets

CAPACITANCE PROBE FOR MAGNETIC RECORDING HEAD TRANSDUCER TO DISC SURFACE SPACING MEASUREMENT

The present application claims the benefit of earlier filed U.S. provisional application Ser. No. 60/031,074, entitled CAPACITANCE PROBE FOR MAGNETIC RECORDING HEAD TRANSDUCER TO DISC SURFACE SPACING MEASUREMENT, filed on Nov. 13, 1996.

BACKGROUND OF THE INVENTION

The present invention relates generally to capacitance probes for measuring magnetic recording head transducer to disc surface spacing. More particularly, the present invention is directed toward a capacitance probe fabricated by patterning a capacitance plate over a transducer element on a slider body such that the air bearing surface (ABS) characteristics are preserved.

Disc drive data storage systems utilize read/write transducers contained within a slider body (typically collectively referred to as a read/write head) which "flies" above a rotating magnetic storage disc. In the production of disc drive data storage systems, it is useful to make non-contact measurements of the distance between a magnetic disc surface and the read/write head (i.e., the fly height). Further, it is useful to map the overall disc topography using such fly height measurements. Accurate measurements of the spacing between the read/write head and the disc surface is a necessity in any hard disc drive design to verify the head-to-disc interface functionality for mechanical, tribological and electrical performances.

Fly height testers using light interferometry principles have been utilized for years. However, such devices can only be used with a transparent glass disc and can only perform the fly height measurement with the head in a static flying position. Further, these devices cannot measure the gap spacing at the transducer. Therefore, transducer spacing estimates are often obtained by extrapolation and can be inaccurate due to surface curvature existing in the ABS of the slider body.

Also in the prior art, capacitance probe fly height testers have been used in which the entire slider body of the read/write head acts as a first capacitance plate, with the disc surface acting as the second capacitance plate. Between the two capacitance plates, a fly height indicating capacitance can be measured. However, using the entire slider body as a capacitance plate does not provide information needed to determine the roll characteristics of the slider. This configuration can only measure gross average slider-to-disc surface spacing and will not provide transducer gap spacing values.

Other prior art designs have moved away from the problems associated with using the entire slider body as a capacitance plate by implanting capacitance probes in the slider body, typically at the ABS. However, this requires modification to the slider body which disturbs the ABS and changes the mass and inertial characteristics of the head. Further, with smaller read/write heads, the implanted probe designs are extremely difficult to manufacture and result in very low yields.

Consequently, there is a need for an improved capacitance probe, which overcomes these and other limitations of prior art capacitance probes, so that changes in fly height during dynamic operations such as track seek, actuator slam, latch impact and ramp load/unload can be accurately measured in-situ in a disc drive or at a component level on the actual magnetic storage media being used.

SUMMARY OF THE INVENTION

An apparatus for measuring magnetic recording head transducer to disc surface spacing and a method of fabricating the same are disclosed. A slider body of a read/write head has first and second rails forming portions of an air bearing surface of the slider body. First and second cavities are formed in the first and second rails of the slider body at the air bearing surface. First and second capacitance plates are positioned within the first and second cavities, respectively, such that a surface of each of the first and second capacitance plates is substantially coplanar with at least portions of the air bearing surface. By forming the capacitance plates in cavities at the air bearing surface such that surfaces of the capacitance plates form portions of the air bearing surface, the flying characteristics of the slider body are preserved and dynamic fly height measurements can be made between either of the capacitance plates and the disc surface.

DETAILED DESCRIPTION OF THE PREFERRED EMBODIMENTS

Figure 1:
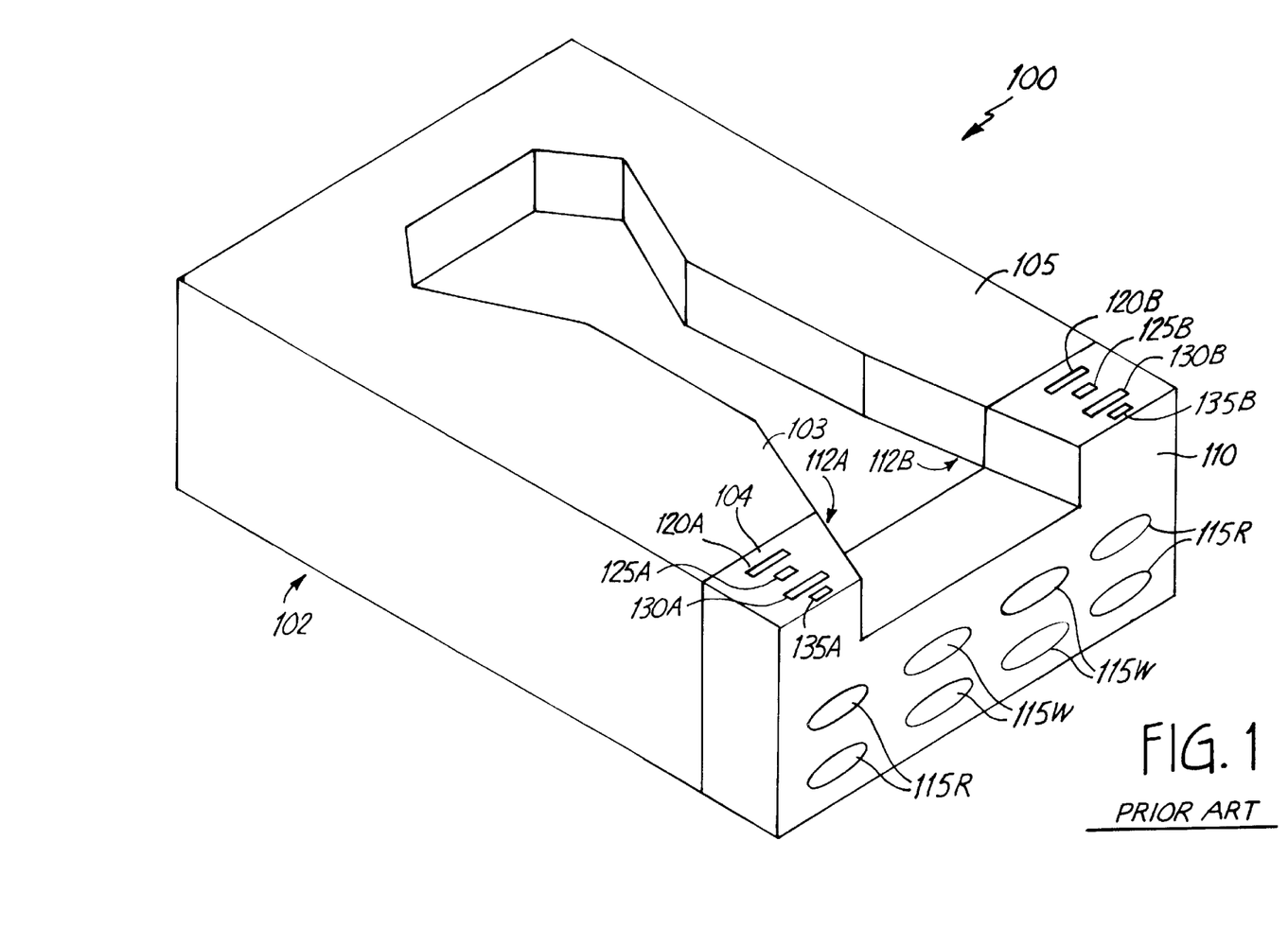
FIG. 1 is diagrammatic view in perspective of a conventional read/write head for use in a disc drive data storage system.

FIG. 1 is a diagrammatic view in perspective which illustrates a conventional read/write head 100 of the type used in disc drive data storage systems. Head 100 includes slider body 102 having an air bearing surface (ABS) 105 and a trailing edge face or surface 110. Slider body 102 can include ceramic portion 103 and base coat portion 104. Base coat portion 104 can be, for example, $Al_2O_3$ or other suitable materials. As is known in the art, the various transducers and other read/write components can be deposited on top of base coat 104 as the head is built up toward the trailing edge 110 during fabrication.

On each of first rail 112A and second rail 112B of slider body 102, head 100 includes components such as lower magnetoresistive (MR) shield 120A or 120B, MR element (MRE) 125A or 125B, mid shield or shared pole 130A or 130B, and top or write pole 135A or 135B. Since like components on the two rails of slider body 102 are typically discussed simultaneously, the specific designation (i.e., the A or B designation in FIG. 1) is frequently omitted from the discussion. However, it must be understood that the discussion applies to components on either or both rails.

Lower shield 120, MRE 125, mid shield 130, and top pole 135 are formed within slider body 102 at locations exposed to or near ABS 105. Bond pads 115R and 115W are positioned on trailing edge face 110 or other surfaces of slider body 102. Bond pads 115R are electrically coupled in pairs to MRE 125. Bond pads 115W are electrically coupled in pairs to inductive write transducer coils (not shown).

Figure 2:
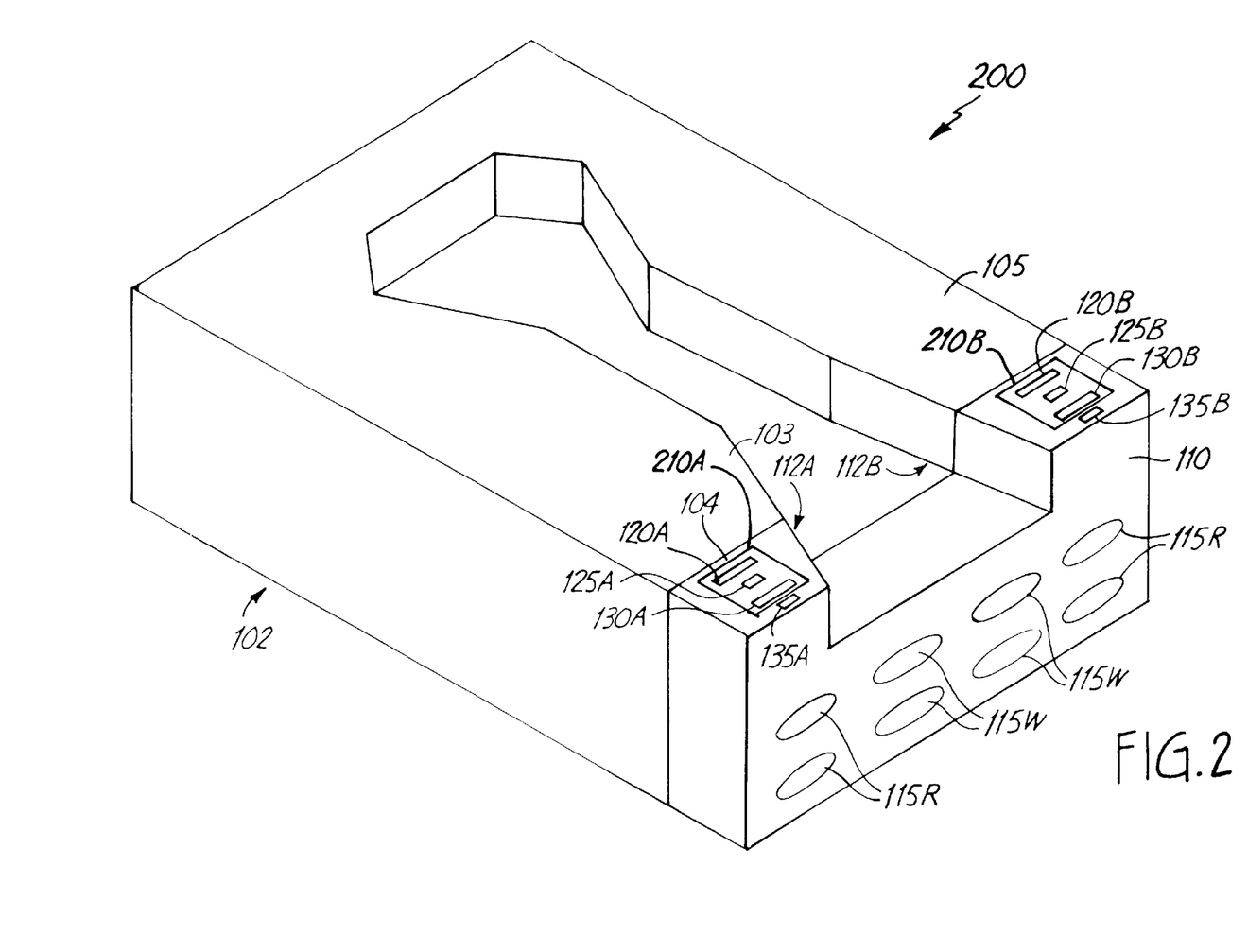
FIG. 2 is a diagrammatic view in perspective of the improved capacitance probe of the present invention formed as a portion of the ABS of a read/write head.

FIG. 2 is a diagrammatic view in perspective of measuring apparatus 200 in accordance with preferred embodiments of the present invention. It must be noted that, as used herein, measuring apparatus 200 includes one or more capacitance plates combined with the read/write head. Measuring apparatus 200 can also be referred to as a capacitance probe. However, the term "capacitance probe" can also be used to refer only to the capacitance plates formed on the slider body of the read/write head, but not to the entire apparatus. Both definitions can be used to describe the present invention.

Like read/write head 100 illustrated in FIG. 1, measuring apparatus 200 includes a read/write head slider body 102 having ABS 105 and trailing edge face 110. Slider body 102 also includes, by way of example, first and second rails 112A and 112B. Because measuring apparatus 200 is preferably fabricated by modifying read/write head 100 as will be discussed in greater detail below, measuring apparatus 200 preferably includes MR read transducers and inductive write transducers on each of rails 112A and 112B. Therefore, measuring apparatus 200 preferably includes at ABS 105 of each rail 112A and 112B, respectively, lower MR shield 120, MRE 125, mid shield 130 and top pole 135. Also, measuring apparatus 200 includes bond pads 115R and 115W connected as described above with reference to head 100.

Measuring apparatus 200 differs from read/write head 100 in that it includes a capacitance plate 210A or 210B deposited in a cavity formed at ABS 105 of slider body 102 on each of rails 112A and 112B. Each capacitance plate (generically referred to as capacitance plate 210) is formed such that it is in electrical contact with the read or write transducer so that the capacitance plate 210 can be electrically accessed through the corresponding bond pads 115R and 115W. Then, during dynamic operations of the disc drive data storage system, capacitance detecting/driver circuitry can be coupled to each capacitance plate 210 through the corresponding pair of bond pads.

Figure 3:
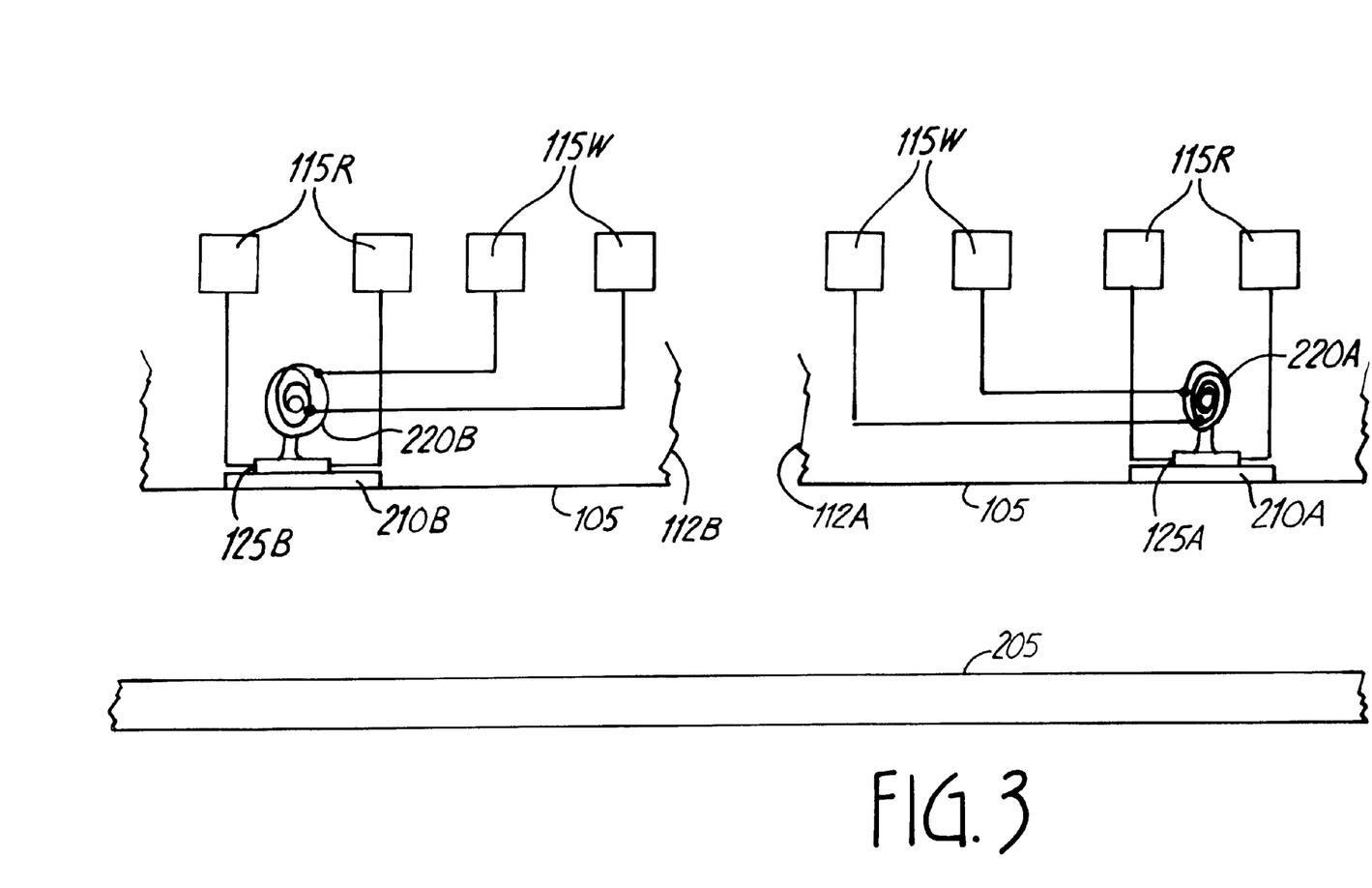
FIG. 3 is a diagrammatic view of two separate capacitance plates on the left and right rails of a read/write head slider body in accordance with preferred embodiments of the present invention.

FIG. 3 illustrates the concept of the capacitance measuring apparatus of FIG. 2 in a slightly different manner. FIG. 3 illustrates a portion of slider body 102 of apparatus 200 as it "flies" above a surface of magnetic storage disc 205, while disc 205 rotates beneath apparatus 200. As illustrated diagrammatically in FIG. 3, a pair of bond pads 115R is coupled to each MRE 125 of the read transducers, and a pair of bond pads 115W is coupled to coils 220A or 220B (generically referred to as coils 220) of each inductive write transducer. In the preferred embodiment illustrated in FIG. 3, a capacitance plate 210 is formed within each of rails 112A and 112B of slider body 102 at ABS 105 such that each capacitance plate 210 is in direct contact with the corresponding MRE 125. Thus, bond pads 115R can be used to couple each capacitance plate 210 to capacitance probe driver circuitry. Therefore, with the capacitance formed between either plate 210 and disc 205 being dependent upon the distance between the particular plate and the disc, fly height of slider body 102 at the location of the particular capacitance plates 210 can be monitored. Measuring the capacitance between both capacitance plates and the disc simniultaneously provides information on the roll characteristics of the slider. The gap spacing change can be derived from changes in the measured capacitances using Equation 1.

$$\text{Gap spacing change} = \in A/\delta c \qquad \text{Equation 1}$$

where, $\in$=dielectric constant of air

A=surface area of the capacitance plate $\delta c$=change in capacitance

Preferably, capacitance plate 210 on each rail 112A and 112B of the slider body 102 forms a surface which is coplanar with ABS 105 so that the ABS remains substantially non-modified, thus preserving the fly characteristics of slider body 102. Also, the capacitance plates are preferably formed from a material which substantially preserves the inertial characteristics of the slider body. Since capacitance plates 210 are formed directly over the transducers, the change in spacing between the read/write transducer and the disc surface during dynamic operations of the disc drive can be measured more accurately than has been previously possible. With flying characteristics of slider body 102 preserved due to substantially non-modified ABS 105, and with capacitance plates 210 being electrically accessible via existing bond pad 115 (either 115R or 115W depending upon the particular embodiment), slider body 102 fly height and transducer-to-disc spacing changes can be accurately measured during operations and events such as: track accessing; actuator slam; latch impact during power down; ramp load/unload; low frequency vibrations; disc surface waviness from clamping distortion; flying over asperities; flying over a textured landing zone; take-off and landing dynamics; operation at various altitudes; and operation at various temperatures. Also, roll motion of the slider can be measured in addition to the fly height at the transducer gap.

Figure 4:
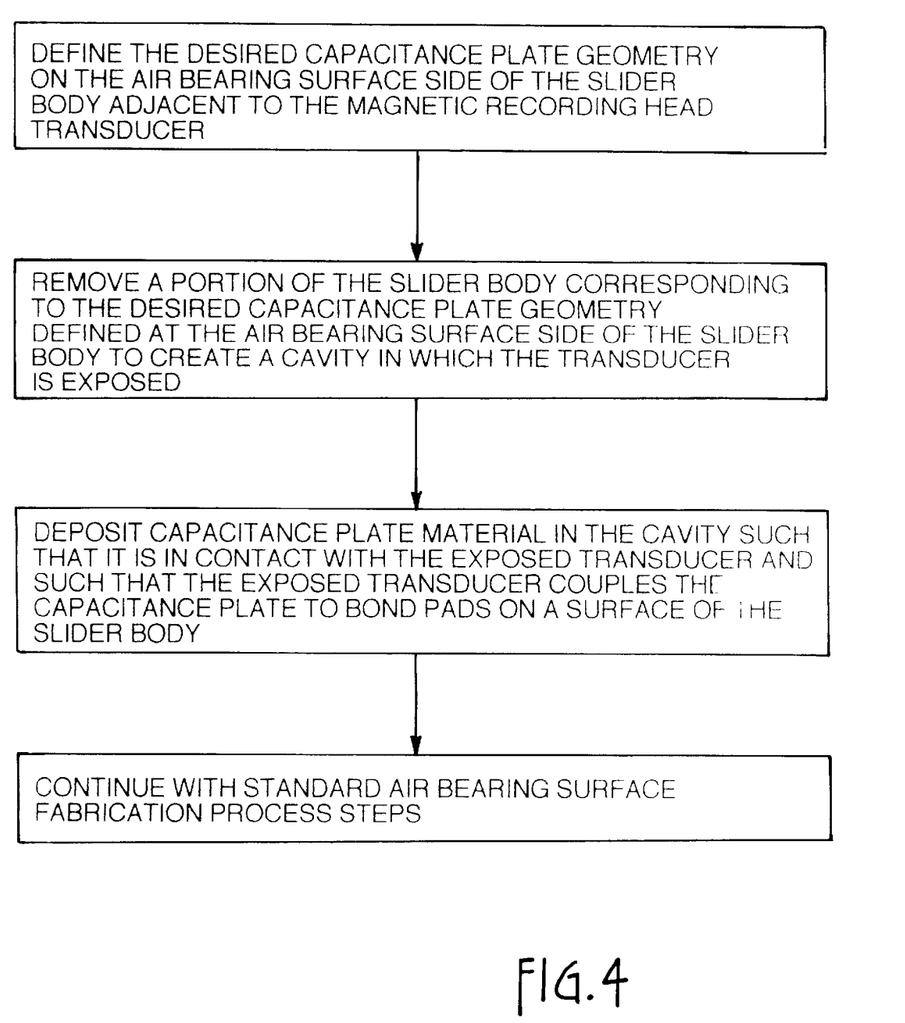
FIG. 4 is a flow diagram illustrating one preferred method of fabricating the capacitance probes of the present invention.
Figure 5A:
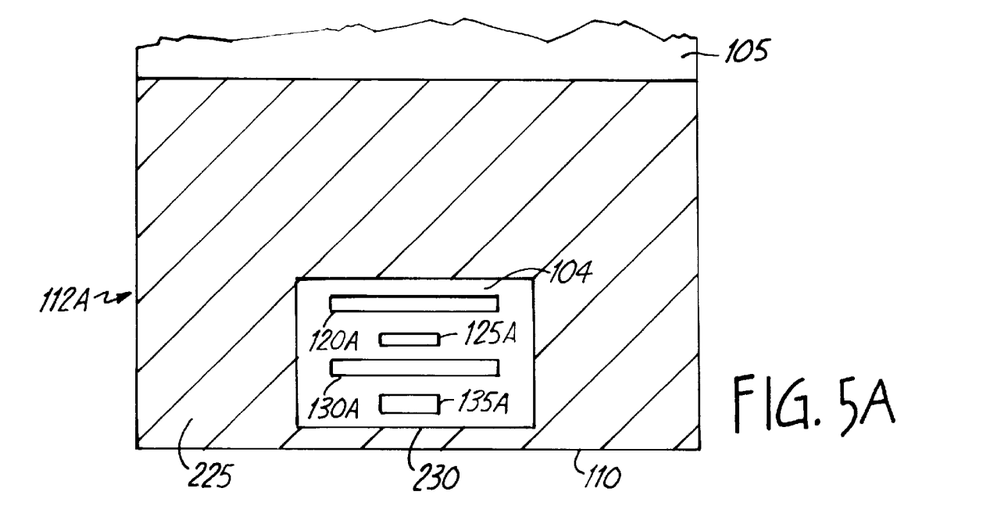
FIGS. 5A and 5B are views, from the ABS and trailing edge, respectively, of a first step in a method of fabricating capacitance probes in accordance with preferred embodiments of the present invention.
Figure 5B:
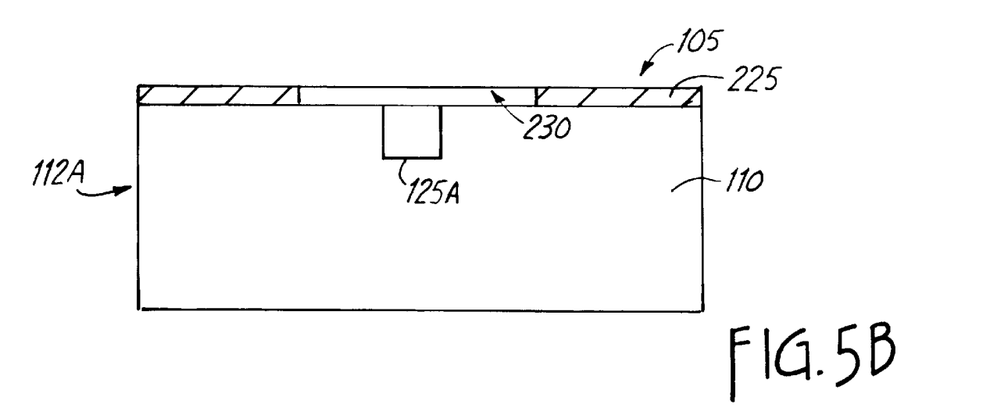
Figure 6A:
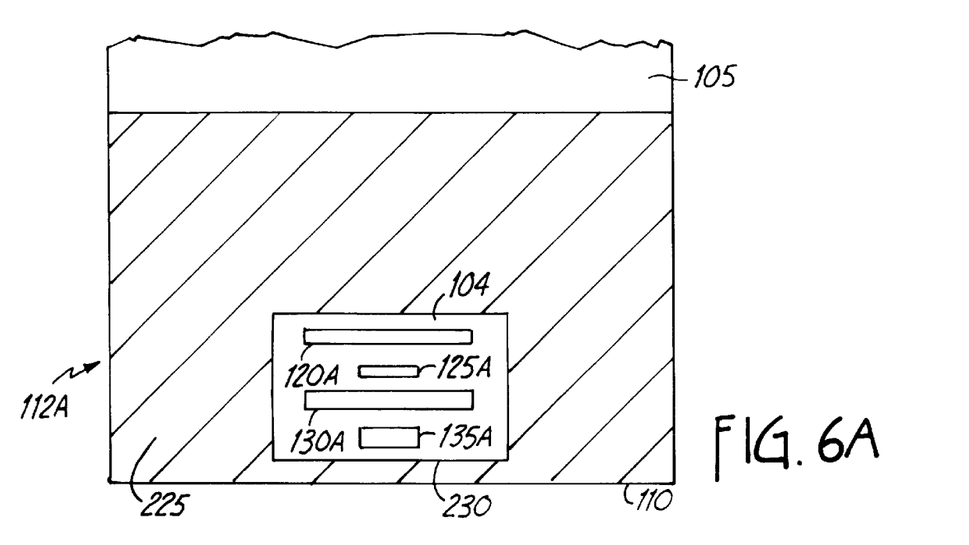
FIGS. 6A and 6B are views, from the ABS and trailing edge, respectively, of a second step in the method of fabricating capacitance probes in accordance with preferred embodiments of the present invention.
Figure 6B:
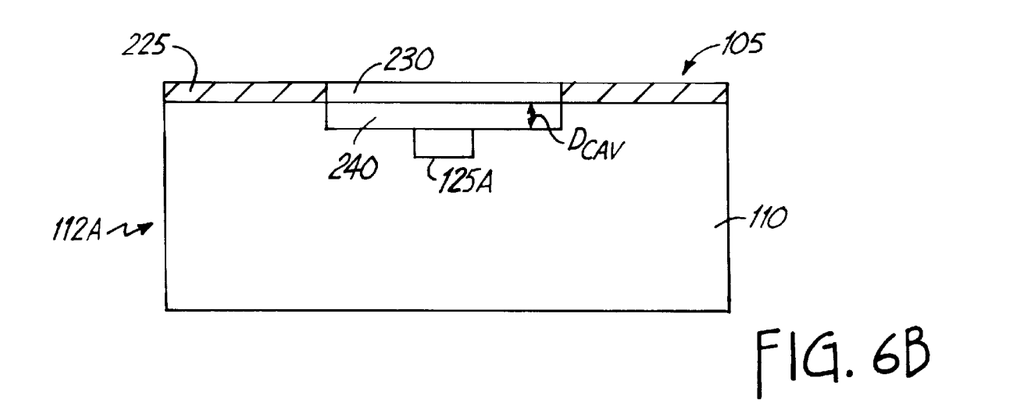

FIG. 4 is a flow diagram illustrating a method of fabricating measurement apparatus 200 in accordance with preferred embodiments of the present invention. FIGS. 5A, 5B, 6A, 6B, 7, 8, 9A and 9B illustrate various steps of the method described in the flow diagram of FIG. 4. The various steps are preferably implemented during slider processing of a plurality of sliders. First, the desired capacitance plate geometry is defined on ABS 105 of slider body 102 adjacent to the read/write transducer through which the capacitance plate 210 will be electrically accessed. This is illustrated diagrammatically in the ABS and trailing edge views of FIGS. 5A and 5B, respectively. It must be noted that FIGS. 5A and 5B provide diagrammatic illustrations, with portions shown in section, of only rail 112A. Of course, the method of the present invention can be used to fabricate capacitance plates on two or more rails of the slider body. In fact, it is preferable that measuring apparatus 200 include capacitance plates formed on each of the rails in order to provide roll motion and other information on the fly characteristics of the slider body. Furthermore, the method of the present invention can be used to fabricate apparatus 200 by forming capacitance plates 210 over one or more transducer regions of slider bodies in general, and not just on the rails if a particular slider body design includes the transducer region at a non-rail region of the slider.

As illustrated in FIGS. 5A and 5B, the desired capacitance plate geometry is defined on ABS 105 of rail 112A by placing photoresist 225 on ABS 105, but not over the desired location and geometry 230 of capacitance plate 210. As illustrated, photoresist 225 forms a rectangular capacitance plate geometry 230 in a region of ABS 105 adjacent to and surrounding lower MR shield 120, MRE 125, mid shield 130 and top pole 135. However, capacitance plate geometry 230 need not have a rectangular shape, nor must it cover all of these read/write transducer components. It will be recognized by those skilled in the art that the extent of the coverage of photoresist 22S can be controlled as necessary.

With capacitance plate geometry 230 defined at ABS 105 of slider body 102 at locations adjacent to the transducers, a portion of slider body 102 at ABS 105 corresponding to the defined capacitance plate geometry 230 is removed to create cavity 240 having the capacitance plate geometry 230 in the plane of ABS 105, and having a depth $D_{CAV}$. In some preferred embodiments, cavity 240 is ion milled into slider body 102 and MRE 125 such that cavity 240 has a depth $D_{CAV}$ of approximately 0.5 μm (micrometers). This step of the method of the present invention is illustrated in the ABS and trailing edge views of rail 112A shown in FIGS. 6A and 6B, respectively.

Figure 7:
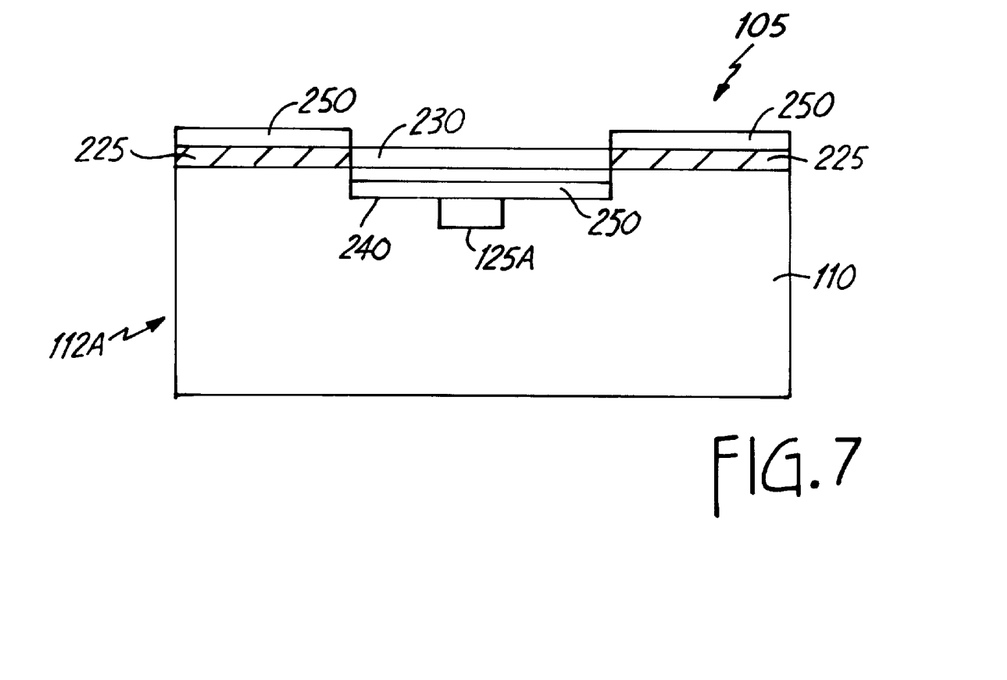
FIG. 7 is a diagrammatic trailing edge view of a third step in the method of fabricating capacitance probes in accordance with preferred embodiments of the present invention.

Next, as is illustrated in the trailing edge view of FIG. 7, capacitance plate material 250 is deposited on top of photoresist 225 and into cavity 240. In preferred embodiments, layer 250 of capacitance plate material is a thin layer of chromium Cr or other metal having a thickness of approximately 0.35 μm. Thus, layer 250 of capacitance plate material preferably does not completely fill cavity 240.

Figure 8:
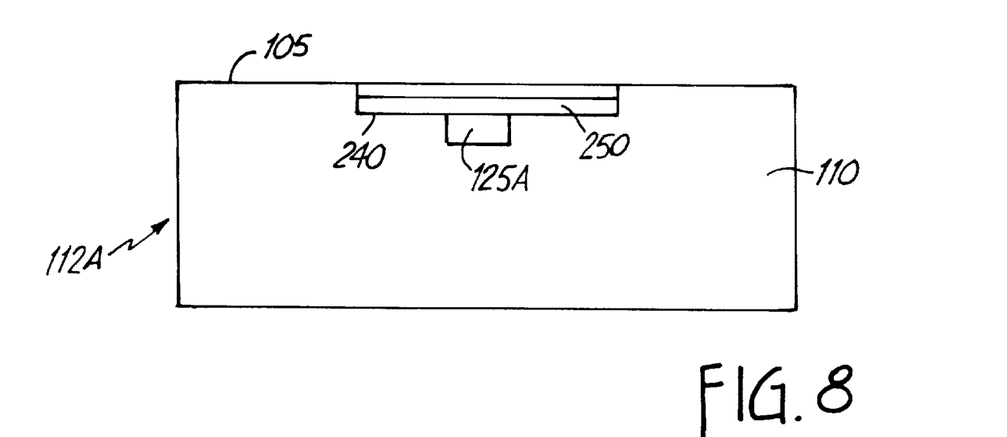
FIG. 8 is a diagrammatic trailing edge view of a fourth step in the method of fabricating capacitance probes in accordance with the preferred embodiments of the present invention.
Figure 9A:
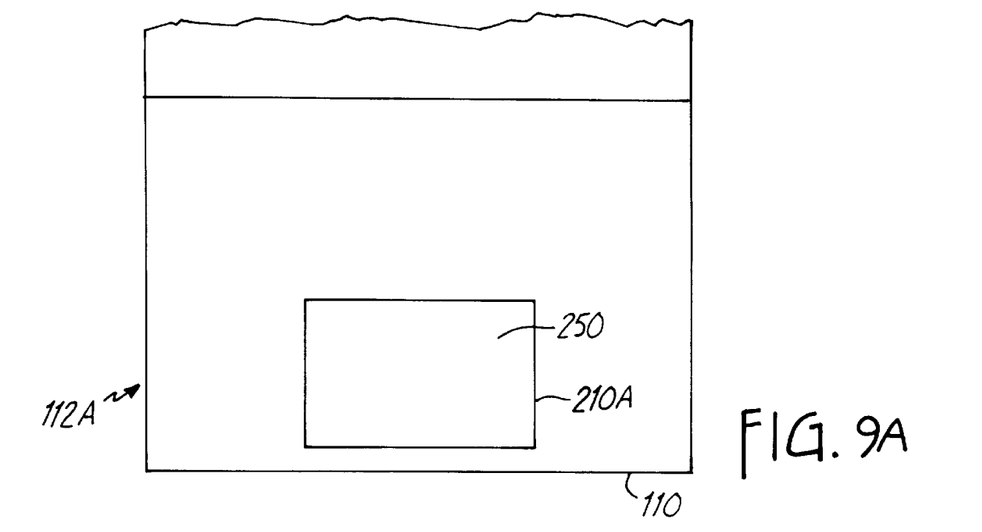
FIGS. 9A and 9B are diagrammatic views, from the ABS and trailing edge, respectively, illustrating a fifth step of the method of fabricating capacitance probes in accordance with preferred embodiments of the present invention.
Figure 9B:
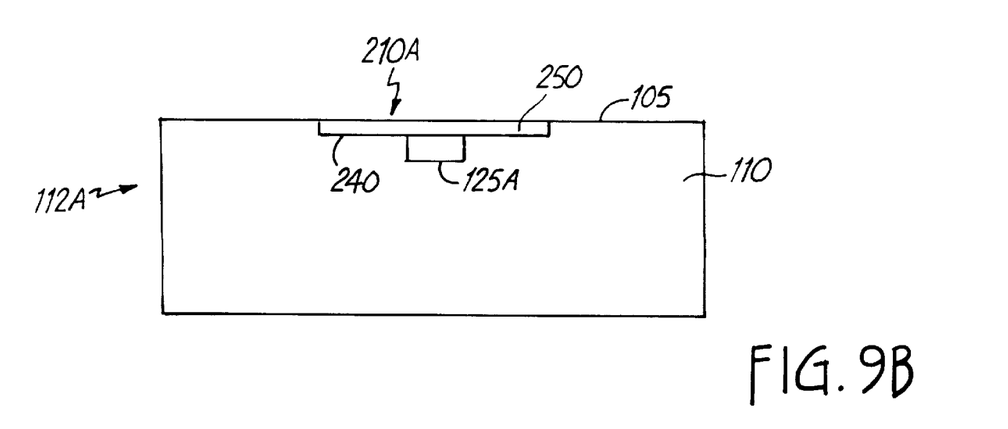

Next, as is illustrated in the trailing edge view of FIG. 8, photoresist 225 is removed from ABS 105 using a lift-off process. Thus, the capacitance plate material on top of the photoresist is removed as well. Finally, as is illustrated in the ABS and trailing edge views of FIGS. 9A and 9B, ABS 105 of slider body 102 is crown lapped or otherwise processed to remove a portion of the slider body at ABS 105 and a portion of capacitance plate material 250. Ideally, with cavity 240 having a depth of 0.15 μm more than the original thickness of capacitance plate material 250 within cavity 240, the crown lapping is controlled to remove 0.2 μm such that the lapping process also removes a portion of capacitance plate material 250. The result is a 0.3 μm thick capacitance plate 210 formed within cavity 240 having a surface which is substantially coplanar with the remainder of ABS 105. Thus, with the planarity and inertial characteristics of ABS 105 substantially preserved, the fly height characteristics of the slider will be substantially unaffected by the existence of capacitance plate material 250. At this point, the standard air bearing fabrication process typically used to fabricate the read/write head can be continued. For example, commonly a thin diamond like carbon (dlc) coating is placed over what otherwise would be ABS 105. In this instance, the thin dlc layer would cover capacitance plate material 250 and would actually become the ABS. However, for ease of illustration, capacitance plates 210 are referred to herein as being coplaner with ABS. It will be understood that the present application also covers these embodiments.

As discussed above, the method of fabricating a capacitive fly height measuring apparatus in accordance with preferred embodiments of the present invention does not result in an effective modification to ABS 105 of slider body 102. Thus, the fly height characteristics of slider body 102 will be preserved, thereby overcoming significant disadvantages of prior art capacitance probe fly height testers. With the plate or probe deposited over the transducers, the change in spacing between the read/write transducer and the disc surface during normal disc drive operations can be measured dynamically arid more accurately than in the past.

Although the present invention has been described with reference to preferred embodiments, workers skilled in the art will recognize that changes may be made in form and detail without departing from the spirit and scope of the invention.

What is claimed is:

1. An apparatus for measuring magnetic recording head transducer to disc surface spacing, the apparatus comprising:
   a slider body having a cavity formed in an air bearing surface of the slider body adjacent the magnetic recording head transducer such that the magnetic recording head transducer is exposed in the cavity;
   a layer of capacitance plate material deposited in the cavity in direct contact with and covering the magnetic recording head transducer; and
   electrical access terminals on a first surface of the slider body and coupled to the magnetic recording head transducer, wherein the direct contact between the layer of capacitance plate material and the magnetic recording head transducer couples the layer of capacitance plate material to the electrical access terminals to thereby facilitate determination of a capacitance formed between the layer of capacitance plate material and the disc surface which is indicative of the magnetic recording head transducer to disc surface spacing.

2. The apparatus of claim 1, wherein the capacitance plate material substantially fills the cavity such that a surface of the layer of capacitance plate material is substantially coplanar with portions of the air bearing surface of the slider body adjacent to the cavity.

3. The apparatus of claim 2, wherein the magnetic recording head transducer is a magnetoresistive transducer.

4. The apparatus of claim 1, wherein the capacitance plate material is a metal.

5. The apparatus of claim 1, and further comprising a diamond like carbon coating covering the air bearing surface and the capacitance plate material.

6. An apparatus for measuring magnetic recording head transducer to disc surface spacing, the apparatus comprising:
   a slider body having first and second rails forming portions of an air bearing surface of the slider body;
   first and second cavities formed in the first and second rails of the slider body at the air bearing surface;
   first and second capacitance plates filling the first and second cavities, respectively, such that a surface of each of the first and second capacitance plates is substantially coplanar with at least portions of the air bearing surface adjacent to the first and second cavities on the first and second rails;
   a first magnetic transducer embedded within the first rail within the first cavity such that the first magnetic transducer is in direct electrical contact with the first capacitance plate;
   a second magnetic transducer embedded within the second rail within the second cavity such that the second magnetic transducer is in direct electrical contact with the second capacitance plate;
   a first set of bond pads positioned on a surface of the slider body and coupled to the first magnetic transducer, thereby providing electrical access to the first capacitance plate; and a second set of bond pads positioned on the surface of the slider body and coupled to the second magnetic transducer, thereby providing electrical access to the second capacitance plate, wherein capacitances formed between the first and second capacitance plates and the disc surface which are indicative of transducer to disc spacing are detectable at the first and second sets of bond pads.

7. The apparatus of claim 6, wherein each of the first and second magnetic transducers include magnetoresistive elements and wherein the first and second capacitance plates are in direct electrical contact with the corresponding magnetoresistive element.

8. A method of fabricating a capacitance probe on a slider body for use in measuring spacing between a magnetic recording head transducer and a magnetic disc surface, the method comprising:

defining a capacitance plate geometry on an air bearing surface of the slider body adjacent to the transducer;

removing a portion of the slider body corresponding to the capacitance plate geometry defined at the air bearing surface to create a cavitate having the capacitance plate geometry, wherein removing the portion of the slider body comprises removing a portion of the transducer at the air bearing surface; and depositing capacitance plate material in the cavity.

9. The method of claim 8, wherein the steps of defining the capacitance plate geometry, removing a portion of the slider body, and depositing the capacitance plate material are performed during slider fabrication of a plurality of slider bodies.

10. The method of claim 8, wherein removing a portion of the transducer at the air bearing surface further comprises removing a portion of a magnetoresistive transducer at the air bearing surface, and wherein depositing capacitance plate material in the cavity further comprises depositing capacitance plate material in the cavity such that the capacitance plate material is in direct contact with the magnetoresistive transducer.

11. The method of claim 8, wherein removing a portion of the slider body corresponding to the capacitance plate geometry at the air bearing surface further comprises removing a portion of the slider body to create the cavity such that it has a depth from the air bearing surface, and wherein depositing capacitance plate material in the cavity further comprises depositing a layer of capacitance plate material having a thickness which is less than the depth of the cavity.

12. The method of claim 8, wherein the step of defining the capacitance plate geometry on the air bearing surface of the slider body further comprises photopatterning the capacitance plate geometry on the air bearing surface of the slader body by depositing photoresist on the air bearing surface of the slider body in areas surrounding a Aesired capacitance plate location and defining the capacitance plate geometry.

13. The method of claim 12, wherein the step of removing a portion of the slider body corresponding to the capacitance plate gec,mnetry defined at the air bearing surface comprises ion etching the cavity into the slider body.

14. The method of claim 13, wherein the step of depositing capacitance plate material in the cavity comprises:

depositing a layer of capacitance plate material in the cavity and on top of the photoresist on the air bearing surface of the slider body in areas surrounding the cavity; and removing the photoresist and layer of capacitance plate material from the air bearing surface of the slider body in areas surrounding the cavity using a lift-off process.

15. The method of claim 14, and further comprising lapping the air bearing, surface of the slider body to remove portions of the air bearing surface and portions of the capacitance plate material such that the capacitance plate material forms a surface which is coplanar with at least a portion of the air bearing surface.

* * * * *

UNITED STATES PATENT AND TRADEMARK OFFICE
CERTIFICATE OF CORRECTION

PATENT NO. : 6,046,596
DATED : April 4, 2000
INVENTOR(S) : Mark J. Schaenzer et al.

It is certified that error appears in the above-identified patent and that said Letters Patent is hereby corrected as shown below:

Col. 7, line 24, delete "cavitate" and insert --cavity--.

Col. 8, line 15, delete "slader" and insert --slider--.

Col. 8, line 16, delete "Aesire" and insert --desired--.

Col. 8, line 21, delete "gec,mnetry" and insert --geometry--.

Signed and Sealed this

Twenty-fourth Day of April, 2001

Attest:

NICHOLAS P. GODICI

*Attesting Officer*   *Acting Director of the United States Patent and Trademark Office*